United States Patent
Yang et al.

(10) Patent No.: US 10,839,915 B1
(45) Date of Patent: *Nov. 17, 2020

(54) BITLINE BOOST FOR NONVOLATILE MEMORY

(71) Applicant: SanDisk Technologies LLC, Addison, TX (US)

(72) Inventors: Xiang Yang, San Jose, CA (US); Ohwon Kwon, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/454,468

(22) Filed: Jun. 27, 2019

(51) Int. Cl.
| | |
|---|---|
| *G11C 16/10* | (2006.01) |
| *G11C 16/24* | (2006.01) |
| *G11C 16/04* | (2006.01) |
| *G11C 16/14* | (2006.01) |
| *G11C 13/00* | (2006.01) |
| *G11C 16/32* | (2006.01) |
| *G11C 16/26* | (2006.01) |

(52) U.S. Cl.
CPC ............ *G11C 16/24* (2013.01); *G11C 13/004* (2013.01); *G11C 13/0004* (2013.01); *G11C 16/0483* (2013.01); *G11C 16/10* (2013.01); *G11C 16/14* (2013.01); *G11C 16/26* (2013.01); *G11C 16/32* (2013.01)

(58) Field of Classification Search
CPC ...................................................... G11C 16/10
USPC ................................................... 365/185.18
See application file for complete search history.

(56) References Cited

U.S. PATENT DOCUMENTS

| | | | |
|---|---|---|---|
| 9,299,404 B1 | 3/2016 | Ch'ng et al. | |
| 10,559,365 B2 * | 2/2020 | Yang ..................... | H01L 23/528 |
| 2005/0057967 A1 * | 3/2005 | Khalid ............... | G11C 16/0483 |
| | | | 365/185.02 |
| 2008/0159004 A1 * | 7/2008 | Hemink .............. | G11C 11/5628 |
| | | | 365/185.25 |
| 2013/0208545 A1 | 8/2013 | Lee | |
| 2013/0272067 A1 * | 10/2013 | Lee ........................ | G11C 16/10 |
| | | | 365/185.11 |

(Continued)

FOREIGN PATENT DOCUMENTS

KR  20150008377 B1  1/2015

OTHER PUBLICATIONS

International Search Report, PCT/US2019/067349, dated Jul. 2, 2020.

*Primary Examiner* — Min Huang
(74) *Attorney, Agent, or Firm* — Dickinson Wright PLLC; Steven Hurles

(57) ABSTRACT

A methodology and structure for a bit line boost during a programming operation in a nonvolatile memory are described. The inhibit bit line is driven for a first precharge time period with a constant current. The program bit line boost is delayed for a second precharge time period while continuing to drive the inhibit bit line to account for a resistance-capacitance (RC) delay on the inhibit bit line. Thereafter, the program bit line is boosted at the end of the second time period to a program voltage level. The signal level at the fare end of the bit line remote from the driven end of the bit line is sensed to determine when the inhibit bit line reaches a level (e.g. VDDSA) or a level at which the current limits are turned off. Thereafter, the bit line boost can be performed.

18 Claims, 11 Drawing Sheets

(56) References Cited

U.S. PATENT DOCUMENTS

| | | | |
|---|---|---|---|
| 2014/0126291 A1* | 5/2014 | Mihnea | G11C 16/10 365/185.17 |
| 2015/0262655 A1 | 9/2015 | Hsieh et al. | |
| 2019/0122721 A1 | 4/2019 | McCombs | |

* cited by examiner

BITLINE BOOST FOR NONVOLATILE MEMORY

TECHNICAL FIELD

This disclosure relates to memory systems, and in particular, to memory methods and systems with a negative wordline voltage for an erase operation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, such as a source select line and a drain select line.

SUMMARY

This disclosure relates generally to memory systems and methods that.

An aspect of the disclosed embodiments of the present disclosure includes a non-volatile memory, e.g., a NAND memory, pre-charge for programming, which includes receiving a program command, holding a program bit line at a low voltage level, turn on a select gate drain connected to a vertical string of memory cells, when the select gate drain is at a high level, driving an inhibit bit line for a first precharge time period with a constant current, delaying program bit line boost for a second precharge time period while continuing to drive the inhibit bit line to account for a resistance-capacitance (RC) delay on the inhibit bit line, and boosting the program bit line at the end of the second time period to a program voltage level.

In an aspect of the present disclosure, the method includes delaying program bit line boost for a second precharge time period overcomes the RC delay in the inhibit bit line based on capacitive coupling of the program bit line and the inhibit bit line, which are adjacent each other.

In an aspect of the present disclosure, the method includes the inhibit bit line and program bit line being capacitively coupled.

In an aspect of the present disclosure, the method includes driving the inhibit bit line includes applying voltage at a near end of the inhibit bit line.

In an aspect of the present disclosure, the method includes delaying program but line boost includes sensing a voltage level at a far end of the inhibit bit line.

In an aspect of the present disclosure, the sensing includes reading the voltage at the far end of the inhibit bit line at a comparator positioned at the far end of the bit line to determine whether the voltage at the far end of the inhibit bit line reaches an inhibit voltage level.

In an aspect of the present disclosure, the reading includes changing a state of sensing memory cell at the far end of the inhibit line, the memory cell changing state when the far end of the inhibit bit line reaches the inhibit voltage.

In an aspect of the present disclosure, the reading includes changing phase in the memory cell of a phase change memory array connected to the far end of the inhibit bit line.

In an aspect of the present disclosure, the reading includes changing resistance in the memory cell of a resistive memory that changes resistive state at the inhibit voltage level.

An aspect of the disclosed embodiments of the present disclosure include a NAND memory with a plurality of bit lines adjacent to one another on a same level, the bit lines being elongate from a first end to a second end, a plurality of memory strings with a plurality of memory cells and arranged in an array of rows and columns, the plurality of memory strings being connected to plurality of bit lines with one bit line of the plurality of bit lines defining a column in the array, a plurality of wordlines connected to rows of in the array, bit line drive circuitry connected to the first end of the plurality of bit lines, sense circuitry connected to the second end of the plurality of bitlines, and controller circuitry electrically connected to the bit line drive circuitry and the sense circuitry.

In an aspect of the present disclosure, the controller circuitry is configured to hold a program bit line of the plurality of bit lines at a low voltage level.

In an aspect of the present disclosure, the controller circuitry is configured to turn on a select gate drain connected to a string of the plurality of memory strings to a high level;

In an aspect of the present disclosure, when the select gate drain is at the high level, the controller circuitry is configured to drive an inhibit bit line of the plurality of bit lines for a first precharge time period with a constant current.

In an aspect of the present disclosure, the controller circuitry is configured to delay program bit line boost for a second precharge time period while continuing to drive the inhibit bit line to account for the RC delay in the inhibit bit line and the program bit line, which is adjacent the inhibit bit line.

In an aspect of the present disclosure, the controller circuitry is configured to boost the program bit line at an end of the second time period to a program voltage level.

In an aspect of the present disclosure, the controller circuitry is configured to delay program bit line boost for a second precharge time period to overcome the RC delay in the inhibit bit line based on the capacitive coupling of the program bit line and the inhibit bit line, which are adjacent to each other.

In an aspect of the present disclosure, the controller circuitry is configured to the inhibit bit line and the program bit line are capacitively coupled.

In an aspect of the present disclosure, the controller circuitry is configured to the bit line drive circuitry drives the inhibit bit line by activating the bit line drive circuitry to apply voltage at the first end of the inhibit bit line.

In an aspect of the present disclosure, the sense circuitry senses a voltage level at the second end of the inhibit bit line and triggers the control circuitry to drive the program bit line of the plurality of bit lines.

In an aspect of the present disclosure, the sensing circuitry includes a comparator to determine whether the voltage at the second end of the inhibit bit line reaches an inhibit voltage level to trigger the control circuitry to drive the program bit line.

In an aspect of the present disclosure, the sensing circuitry includes a sense memory cell at the far end of the inhibit line, the sense memory cell changing state when the second end of the inhibit bit line reaches the inhibit voltage and the change of state triggering the control circuitry to drive the program bit line.

In an aspect of the present disclosure, the sense memory cell includes a phase change memory cell that changes phase when the voltage at the second end reaches the inhibit voltage.

In an aspect of the present disclosure, the sense memory cell includes a resistive memory that changes resistive state at the inhibit voltage level.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1:
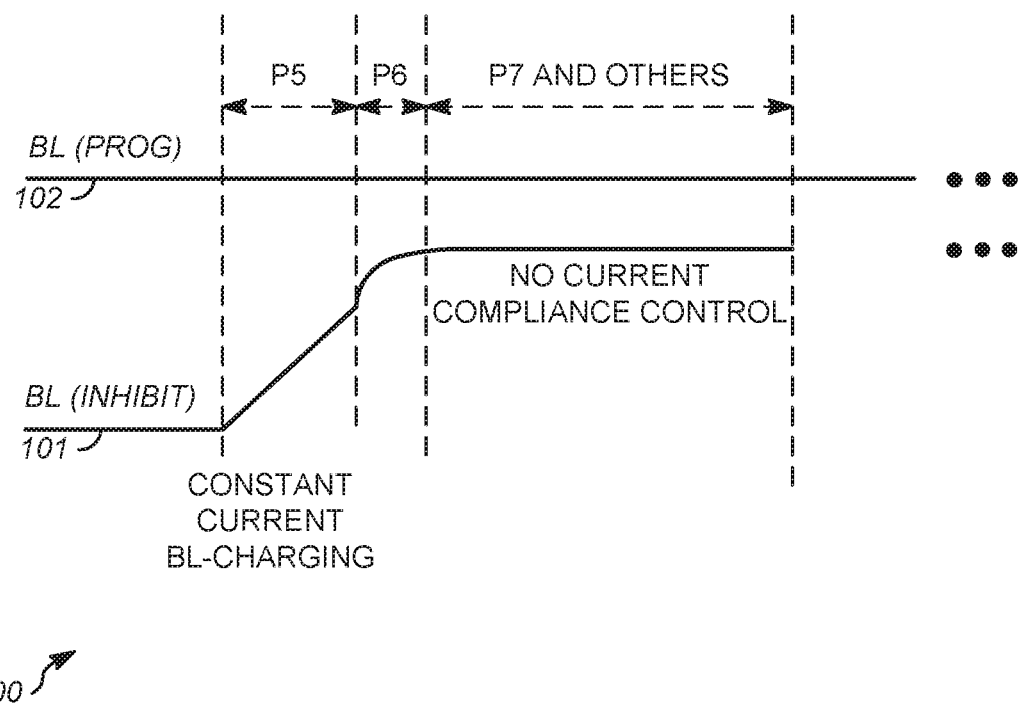
FIG. 1 shows a method for charging an inhibit bit line during a programming operation in a nonvolatile memory.

FIG. 1 generally illustrates a programming timing diagram 100 for bit lines in a non-volatile memory, e.g., a NAND memory device. The bit lines in the memory device are closely adjacent one another and may exhibit strong capacitive coupling, particularly because the bit lines alternate between states, e.g., inhibit state and program state (e.g., low voltage (zero volts and high voltage state, e.g., 2.5 volts). The state of the inhibit bit line 101 is shown as it is charged to provide a programming inhibit state in the channel. The state of the program bit line 102 is shown as it is held at a low state during a programming process. A programming period P5, the inhibit bitline 101 is charges to a level, e.g., about 90% of its final value with a dynamically controlled current supply. This will provide a constant current bit line charging. A time period P6, the current control is removed and the inhibit bit line is charged to its inhibit level, e.g., 2.5 volts or 3.5 volts. At time period P7 and beyond, the inhibit bit line is held at the inhibit voltage (VDDSA) without current control. The memory device includes a comparator circuit that compares a sensed signal on the inhibit bit line until it reaches a threshold value, e.g., 90% of VDDSA. The control of the current draw during time period P5 reduces the peak current draw from the power source. The dies in which the memory devices are formed have differing RC delays in the bit lines, and other circuitry.

In the present methodology, there are capacitive effects between adjacent bit lines as they are positioned close together, are horizontally aligned, and have the same shape. Charging an adjacent bit line induces charge on the other bit line through capacitance. Thus, the voltage on one bit line can induce a voltage on the other bit line. This can be used to induce a bit line boost on a selected inhibit bit line by controlling the charge on the adjacent program bit line(s). This can be used in a program operation to boost the charge on the inhibit bit line above the final voltage, e.g., above VDDSA. In an example embodiment, this can charge the inhibit bit line to its inhibit signal faster by inducing the voltage beyond the final value and the bit line charging to it far end faster than in traditional methods.

The near end and far end of the bit lines are connected to a signal source circuitry and a sense circuitry, respectively. The signal source circuitry can connect the inhibit bit lines to the controlled current source and the non-current limited signal source. The far end of the inhibit lines are connected to sense circuitry to sense the signal level at the far end of the bit lines. That is, in an example embodiment, the near end of the bit line is closer to the charge connection than the far end of the bit line. A sense device may be connected to the near end of the bit line. A sense device may be connected to both the near end and the far end of the bit line. Aspects of the present disclosure can add additional steps in the programming with bit line boost including delaying bit line boost mode and a precharge detection of the inhibit bit line. In an example, the method allows and inhibit channel and far sensing circuitry to achieve a precharge voltage (e.g., VDDSA) before the bit line boost. This may reduce program disturb.

Figure 2:
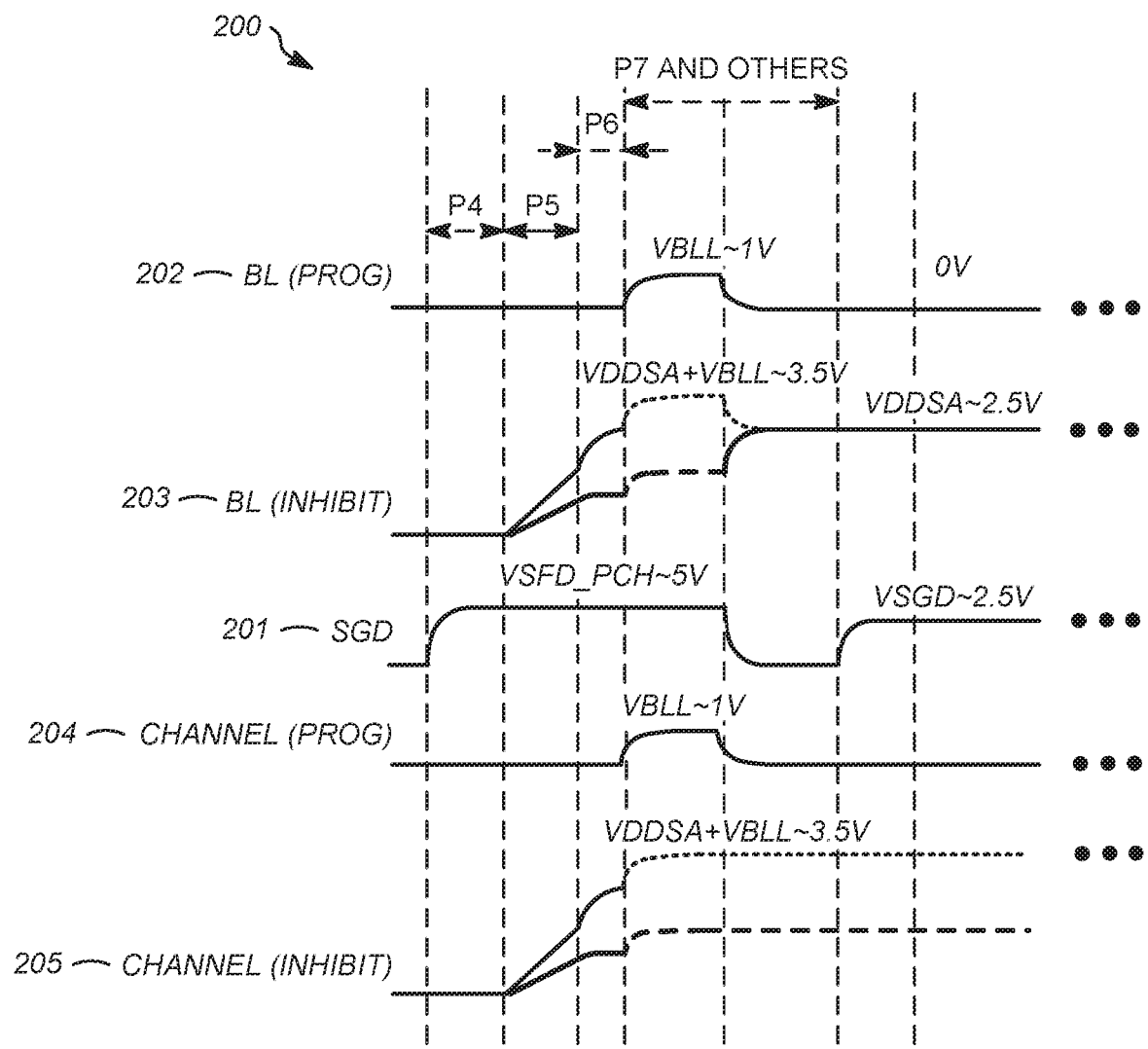
FIG. 2 shows a partial programming diagram for nonvolatile memory according to an aspect of the present disclosure.

FIG. 2 shows a timing diagram 200 during a programming operation of a nonvolatile memory, e.g., a NAND. The calculated or ideal operation is shown in solid line and the actual operation is shown in broken line, with the difference being due in part to the capacitive effects and RC delay between the adjacent bit lines. At the start of program period P4, the select gate transistor 201 (SGD) is transitioned to the high select state. The program bit line 202 remains low. The inhibit bit line 203 remains low. The channel program 204 remains low. The inhibit channel 205 also remains low.

At time period P5, the inhibit bit line 203 is driven high, but is current limited as discussed with regard to FIG. 1. The top line illustrates the ideal state. The lower line represents the actual value of the signal on the inhibit bit line 203. The difference can be attributed at least in part on the RC delay on the inhibit bit line 203. The RC delay is a significant value due to the capacitive link between the inhibit bit line 203 and the program bit line 202.

At time period P6, the signal on the inhibit bit line 203 is ideally at a level where it is now charged without the current limit. However, the real world signal level on inhibit bit line 203 is not charged to the threshold of to turn off the current limit. Thus, the sense circuitry at the far end of the inhibit bit line 203 does not turn off the current limiting of the charge circuitry. Thus, in the real world inhibit bit line 203 will continue to charge after the time period P6 and time period P7. The inhibit bit line signal value never reaches the level of VDDSA plus VBLL, e.g., 3.5 volts. The inhibit channel voltage signal never reaches the boosted value, e.g., VDDSA plus VBLL. The VBLL is the boost voltage on the bit line.

At time period P7, the program bit line 202 is driven to VBLL with the inhibit bit line being floated, which ideally should boost the signal level on the inhibit bit line above the high state. At the end of P7, the program bit line voltage is driven back to zero. The program channel 203 follows the value on the program bit line 202.

In the FIG. 2 embodiment of the timing diagram 200, a memory device implements this bit line boost to boost inhibit bit line voltage higher than VDDSA and thus improve program disturb. However, due to bit line RC delay, the inhibit channel 205 ramps up much slower than the inhibit bit line is driven and thus the inhibit channel 205 rises to VDDSA+VBLL. In many cases, the inhibit channel 205 doesn't even reach its high, inhibit level, e.g., VDDSA.

Figure 3:
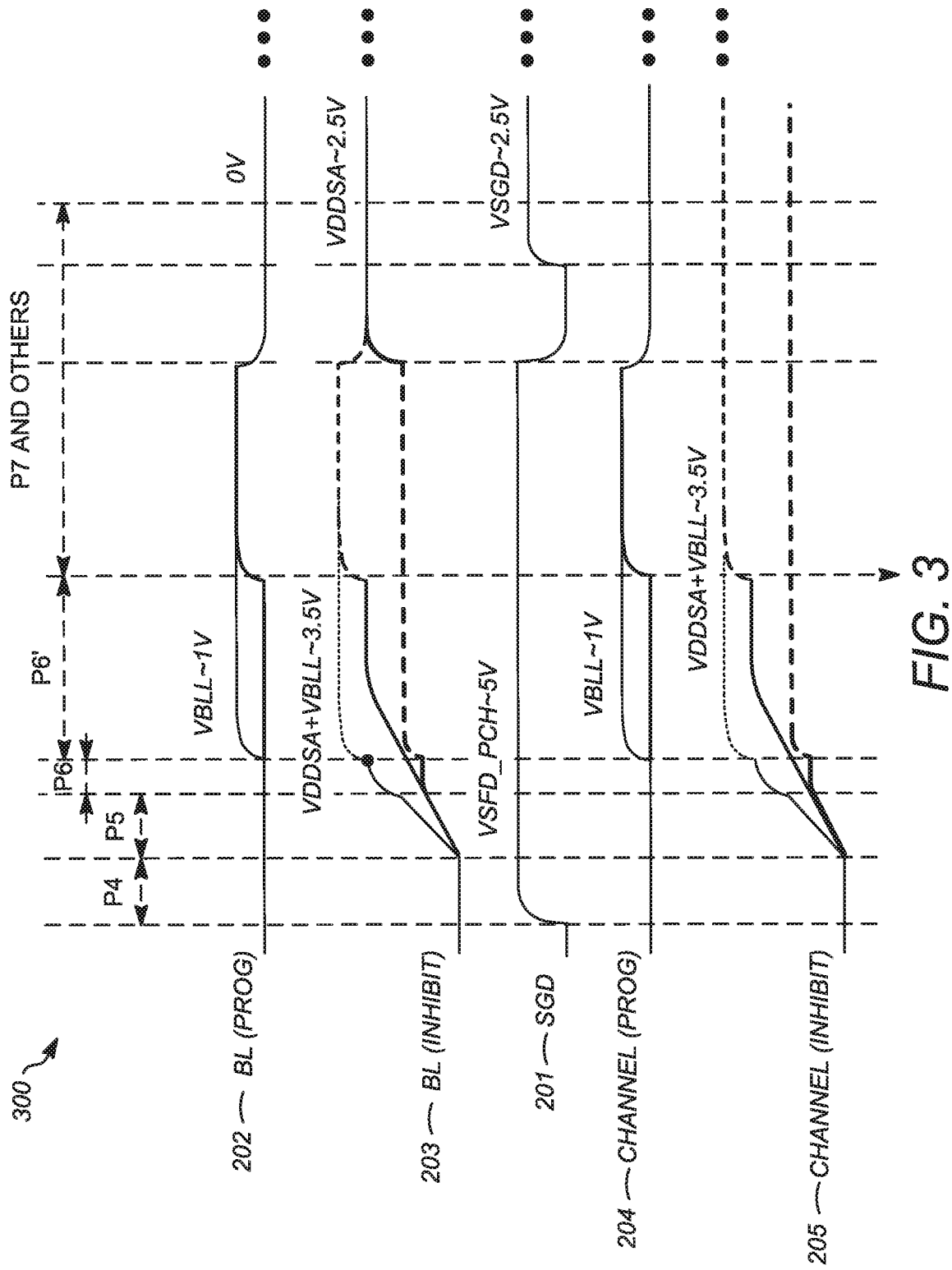
FIG. 3 a partial programming diagram for nonvolatile memory according to an aspect of the present disclosure.

FIG. 3 illustrates a timing diagram 300 for a programming operation on a nonvolatile memory, e.g., a NAND device. The method shown in timing diagram 300 is similar to the timing diagram 200 with the time period P6' being added between time period P6 and P7. The timing diagram 300 shows the ideal operation, the traditional operation and the improved operation using the methodology described herein. The time period P6' operates to delay the bit line boost from the end of time period P6 to the end of time period P6'. This gives the inhibit bit line 203 time to charge to a higher level than the traditional operation and at least partially overcome the RC delay effects. The inhibit bit line 203 charge continues on the charge, e.g., the current limited charging, until the inhibit bit line 203 is determined to reach the level at which non-current limited charging can occur. The circuitry connected to the inhibit bit line can include detection circuitry to detect the charge level on the inhibit bit line 203. The detection circuitry can include a comparator or state change resistive element at the far end of the bit line to detect the signal level at the end of the inhibit bit line 203. After the detection circuitry determines that the inhibit bit line 203 is at the level, then the time period P6' ends and the bit line boost from the program bit line 202 to the inhibit bit line is triggered. This raises the inhibit channel 205 to the level plus the boost. In an example, the device can be tested, e.g., in field, to determine the additional time period P6' that it takes to charge at least one of the inhibit bit lines 203 to the high inhibit level (e.g., VDDSA). This delay time is individual to each die and each block of memory structures. The time period P6' is set to the worst case for any of the bit lines.

Figure 4:
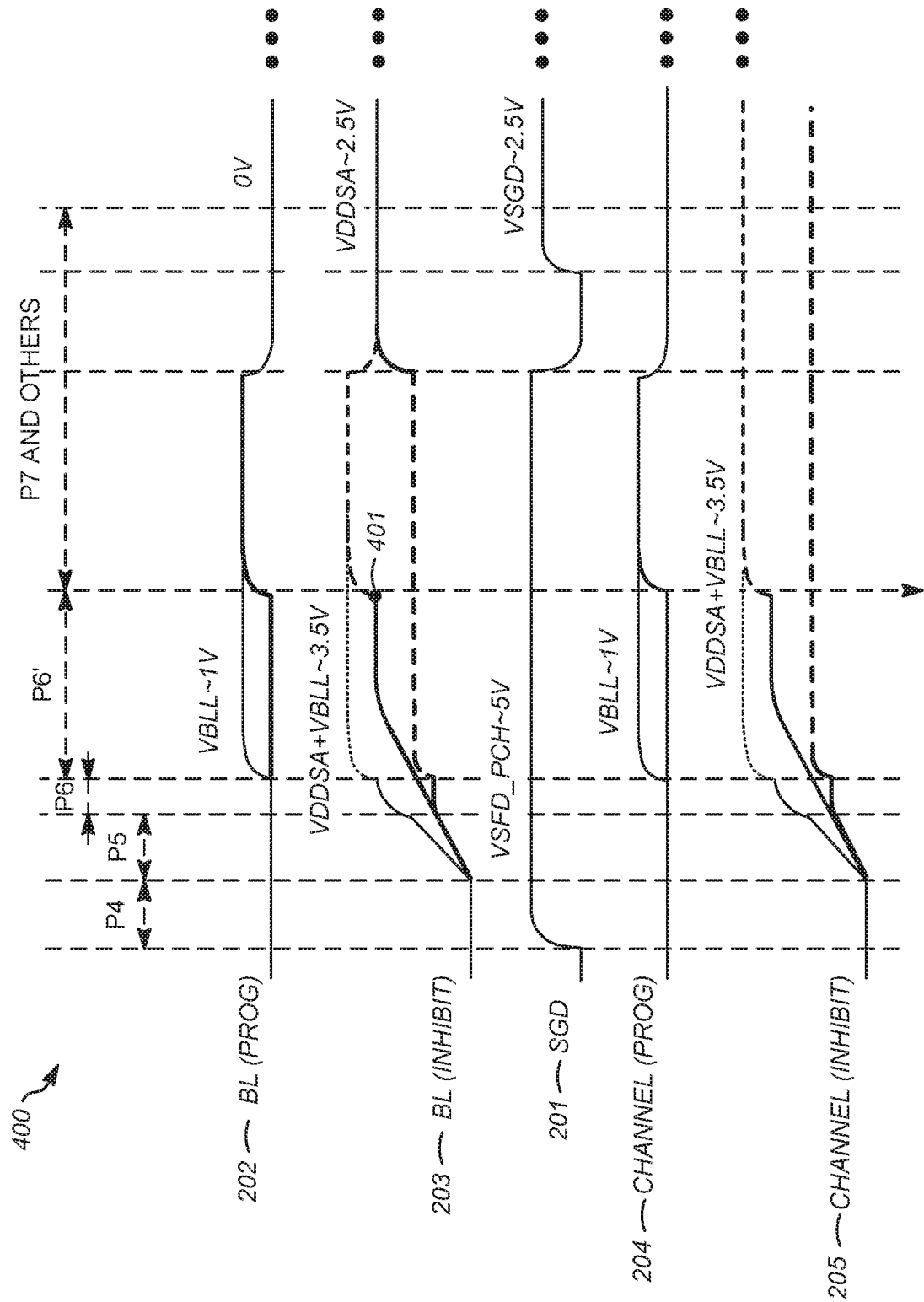
FIG. 4 shows a timing diagram for operating a nonvolatile memory according to an aspect of the present disclosure.

FIG. 4 illustrates a timing diagram 400 for a programming operation on a nonvolatile memory, e.g., a NAND device. The method shown in timing diagram 300 is similar to the timing diagram 300 with the time period P6' being added between time period P6 and P7. The timing diagram 400 shows the ideal operation, the traditional operation and the improved operation using the methodology described herein. The time period P6' operates to delay the bit line boost from the end of time period P6 to the end of time period P6'. This gives the inhibit bit line 203 time to charge to a higher level than the traditional operation and at least partially overcome the RC delay effects. The circuitry connected to the inhibit bit line can include detection circuitry to detect the charge level on the inhibit bit line 203. The detection circuitry can include a comparator or state change resistive element at the far end of the bit line to detect the signal level at the end of the inhibit bit line 203. At 401, the detection circuitry detects that the far end of the inhibit bit line has reached a level of VDDSA or a significant portion (e.g., 90% or more) of VDDSA. After the detection circuitry determines that the far end of the inhibit bit line 203 is at the level, then the time period P6' ends and the bit line boost from the program bit line 202 to the inhibit bit line is triggered. This raises the inhibit channel 205 to the level plus the boost.

In this embodiment, the inhibit bit line 203 signal is detected at a far end of the bit line from the drive circuitry rather than near, driver end. This can operate to guarantee that the bit line boost begins after the inhibit bit line reaches a sufficient level, e.g., sufficient level on the inhibit bit line, e.g., at least 90% of the VDD SA at the far end. This detection method can guarantee inhibit bit line at far end and the inhibit channel rises to the select voltage, e.g., VDDSA or a significant portion of VDDSA, before the inhibit bit line is floated and the bit line boost is triggered.

Figure 5:
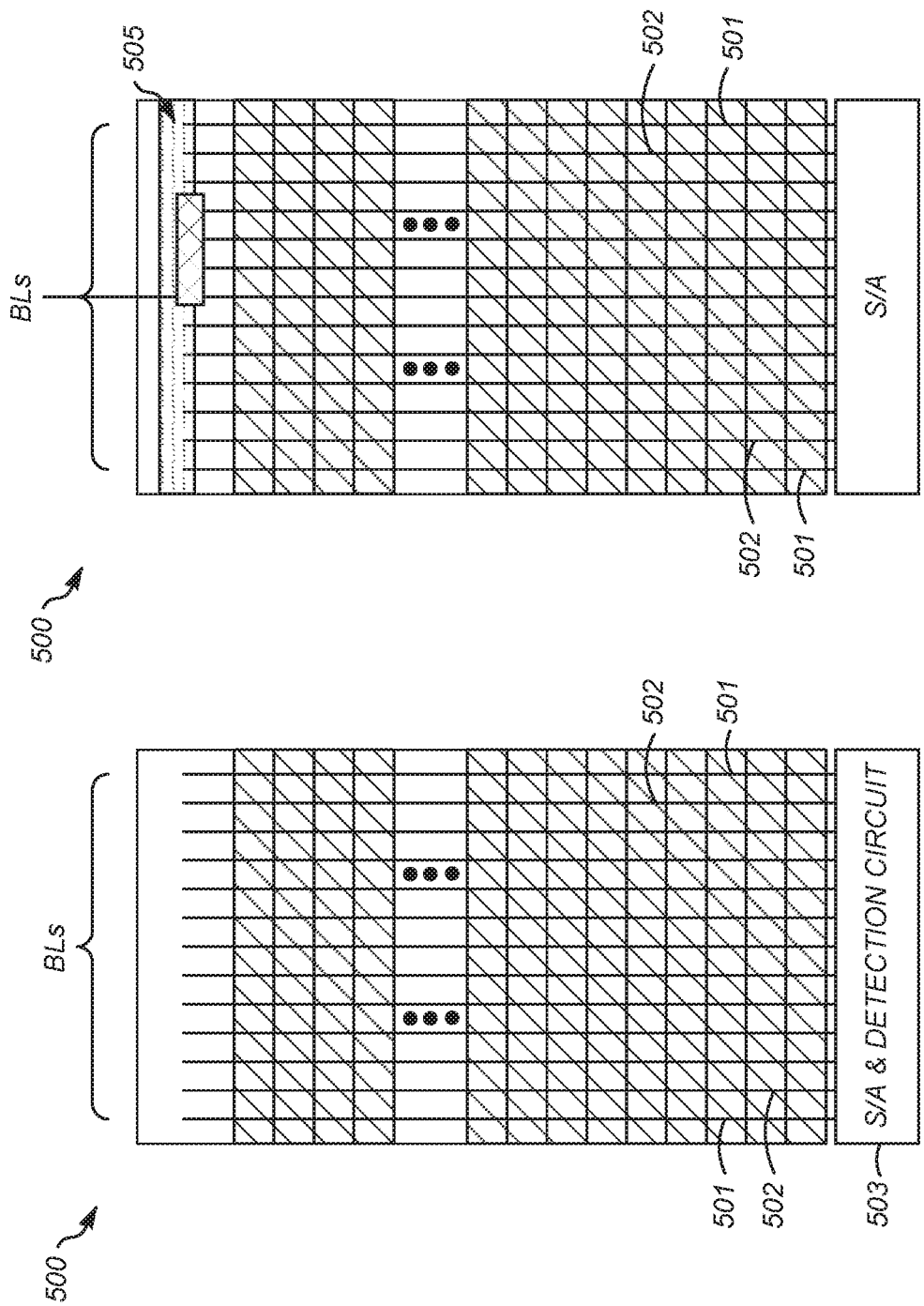
FIG. 5A shows a schematic view of a nonvolatile memory according to an aspect of the present disclosure.
FIG. 5B shows a schematic view of a nonvolatile memory according to an aspect of the present disclosure.

FIG. 5A illustrates a plan view of a NAND memory 500 with a plurality of bit lines 501, 502 extending vertically from a near end control circuitry 503. The bit lines 501, 502 alternate and during a programming operation the bit lines 501 can be the program bit lines and the bit lines 502 can be the inhibit bit lines for a first programming operation and then the bit lines 501, 502 switch to inhibit and program, respectively, during the second programming operation. The control circuitry 503 includes the power circuitry to drive a positive signal onto the bit lines 501, 502. The control circuitry 503 can operate to float the bit lines 501, 502. The control circuitry 503 can reduce the voltage the bit lines 501, 503, e.g., ground the bit lines to zero volts. The control circuitry 503 can include detection circuitry, e.g., comparators, to detect the signal levels on the bit lines 501, 502. The control circuitry 503 can include the voltage generator. The wordlines extend horizontally and cross the plurality of bit lines 501, 502.

FIG. 5B illustrates a plan view of a NAND memory 500 with a plurality of bit lines 501, 502 extending vertically from a near end control circuitry 503. However, the detection circuitry 505 is moved from the near end of the bit lines 501, 502 to the far end of the bit lines 501, 502. The detection circuitry 505 at the far of the bit lines 501, 502 can give a true reading of the signal level on the bit lines 501, 502. This structure can account for the RC delay on the bit lines 501, 502.

Figure 6:
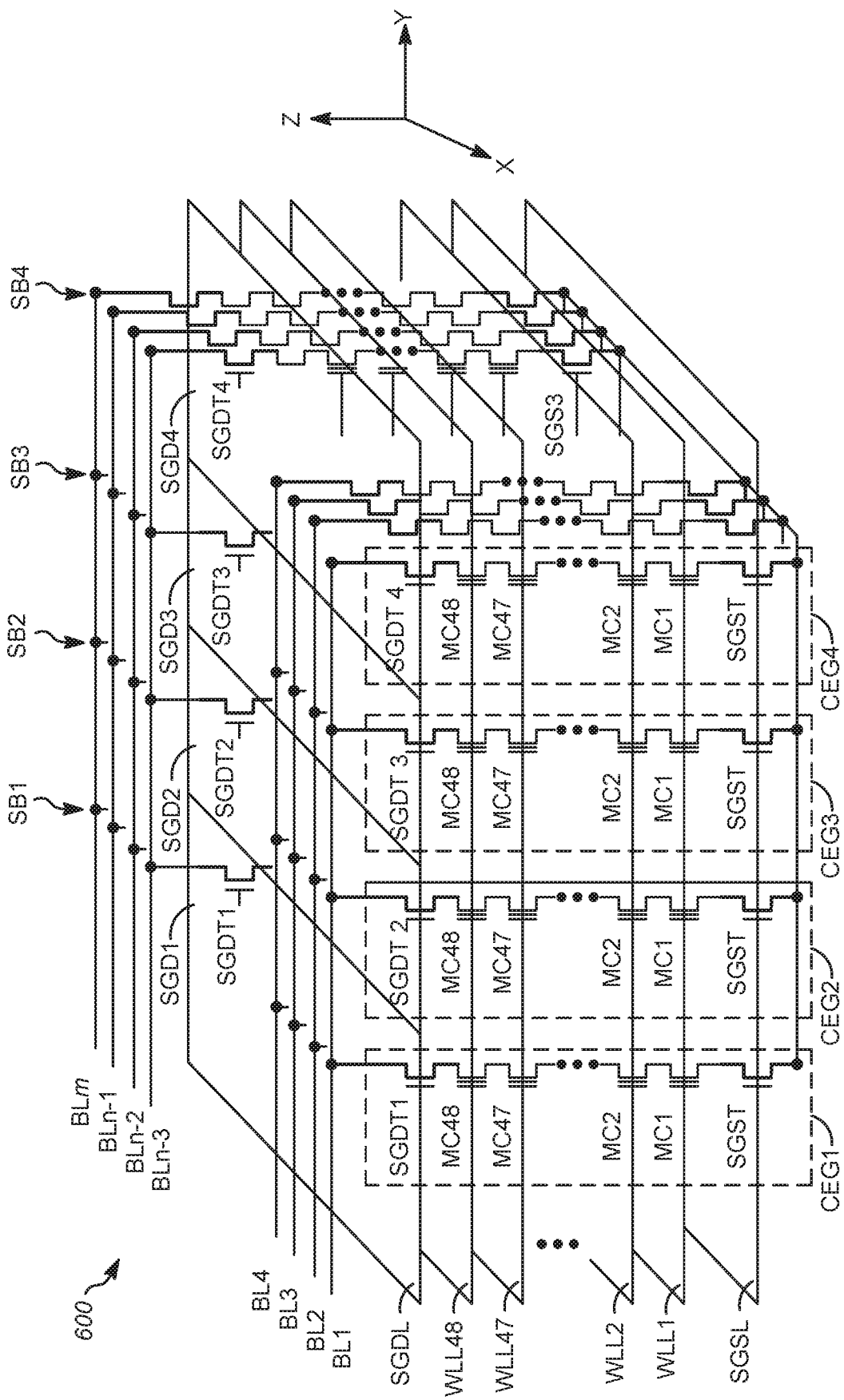
FIG. 6 shows illustrates a circuit schematic diagram of a block of memory cells three-dimensionally arranged into a plurality of NAND strings.

FIG. 6 illustrates a vertical memory structure 600, which can implement the programming with bit line boost as described herein. The memory structure 600 shows a plurality of vertically oriented memory strings that are spaced from left to right. A bit line connects to the top of a plurality of the memory strings, respectively. A NAND string typically includes select gate (SG) transistors at each end. For example, a drain-side select gate (SGD) transistor is at a drain end of the NAND string and a source-side select gate (SGS) transistor is at an opposite source end of the NAND string. FIG. 6 generally illustrates a circuit schematic diagram of an example configuration of a three-dimensional memory circuit 600, which may be representative of at least a portion of a block in a NAND memory device and/or have the physical construction or structure as part of a NAND memory device. In FIG. 6, each bias element is represented or depicted as a transistor or solid state switch. In addition, memory cells are labeled MC, SGD transistors are labeled SGDT, and SGS transistors are labeled SGST. In the example memory circuit 600, each channel element group includes up to fifty cells, including forty eight memory cells, extending from a first memory cell MC1 to a forty-eighth memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described.

In accordance with the channel element group configuration in FIG. 6, the memory circuit 600 includes fifty control gate layers, including forty-eight word line layers extending from a first word line layer WLL1 to a forty-eighth word line layer WLL48, a SGD layer SGDL, and a SGS layer SGSL. The ith memory cells MC1 in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the forty-eighth memory cells MC48 of the channel element groups CEG are disposed in and configured to have their control gates biased by the forty-eighth word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

The channel element groups CEG and their associated channels are two-dimensionally arranged in the x and y directions in the memory circuit 600, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels. The bit lines can be operated according to the timing diagrams and methodology as described herein. The driver circuitry can be connected to a near side of the bit lines BL, e.g., at the left side of memory circuit 600. The detection circuitry can be connected to the near side in an example. The detection circuitry can be connected to the far end of the bit lines BL, e.g., the right side of the memory circuit 600.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

Additionally, or alternatively, the memory cells of a memory circuit or of the memory cell structure generally, are configured to store data as bits or binary digits, with each bit having either a logic "0" or a logic "1" binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include two, three, or four, although MLC cells that store more than four bits may be possible.

During a programming operation in the memory circuit 600, incoming data is transferred from data latch to the NAND memory cells through the bit lines (BL). There are two types of BLs, representing data "1" and "0". For data "0, the bit line corresponds to data "0" are biased to zero volts during programming. The corresponding memory cells receive a complete programming voltage (VPGM) so that threshold voltage (Vt) increases. The voltage potential on these memory cells are VPGM. For data "1," the BL corresponds to data "1" are biased as VDDSA (e.g., about 3V) during programming. This high bias can turn off drain side select gate transistor (SGDT) such that an entire channel is boosted up well above zero volts, (e.g., $V_{channel}$ of about 10V) with further help from an unselected WL (e.g., VPASS is about nine volts). The corresponding memory cells are therefore inhibited from further programming.

Voltage potential on these memory cells is $VPGM-V_{channel}$. Programming the memory 100 includes three phases, namely, pre-charge, program, and verify. During pre-charge, there are three phases. The first phases (sometimes referred to as program 5, P5) the inhibit bitline is charged up with a constant current (e.g., peak current control) until a charging target (e.g., a portion of VDDSA, such as 90% VDDSA) is reached. The second phase (sometimes referred to as program 6, P6) further charges the inhibit BL without current control until final target (e,g., 100% VDDSA). The third phase (sometimes referred to as program 7, P7) holds the inhibit BL at VDDSA for a certain time.

When programming non-volatile memories, such as NAND programming, a trade-off between programming performance (e.g., speed) and reliability (e.g., channel boosting) is made. In order to allow proper channel boosting (e.g., a high $V_{channel}$), the inhibit BL voltage should be as high as possible. However, the inhibit BL high voltage (VDDSA~3V) is strongly coupled to programming BL low voltage (zero Volts) through BL-BL capacitive coupling (RC-delay). As a result, program performance is slowed down as it is necessary to wait until BL voltage signal is fully stable in each programming pulse. On the other hand, to achieve faster BL charging speed by using a lower inhibit BL voltage, severe reliability issues may occur, e.g., inhibit cells are not inhibited properly which may show as a larger Er-state upper tail. This trade-off is especially problematic for QLC (X4, 4 bit per cell) technology where the memory device requires a super strong boosting to prevent program disturb for a particular groups of WLs (usually the higher WLs), while the memory device also needs to be as fast as possible for regular WLs (usually the lower WLs).

The first and second channel element groups CEG1, CEG2 formed around the first and second channels are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the plurality of channels and channel element groups of a block, certain combinations of channels and associated channel element groups are electrically connected to the same bit line as each other, while certain other combinations of channels and associated channel element groups are electrically connected to different bit lines from each other. In addition, a given channel element group may be electrically connected to a given bit line by way of its associated channel and a conductive via electrically connecting the associated channel with the bit line.

The memory structure 600 can operate the methods shown in the timing diagrams 200, 300 and 400. The operation of memory structure 600 can begin when a a program command is received. The bitlines that are the program bit lines are held at a low voltage level. The select gate drain connected to a vertical string of memory cells is turned on. When the select gate drain is at a high level, the inhibit bit line is driven for a first precharge time period with a constant current. This prevents excessive current draw in the memory structure 600. The program bit line boost is delayed for a second precharge time period while continuing to drive the inhibit bit line to account for a resistance-capacitance (RC) delay on the inhibit bit line. Thereafter, the program bit line is boosted at the end of the second time period to a program voltage level. The boosting can be performed by driving the program bit line to a positive voltage while floating the inhibit bit line.

Figure 7:
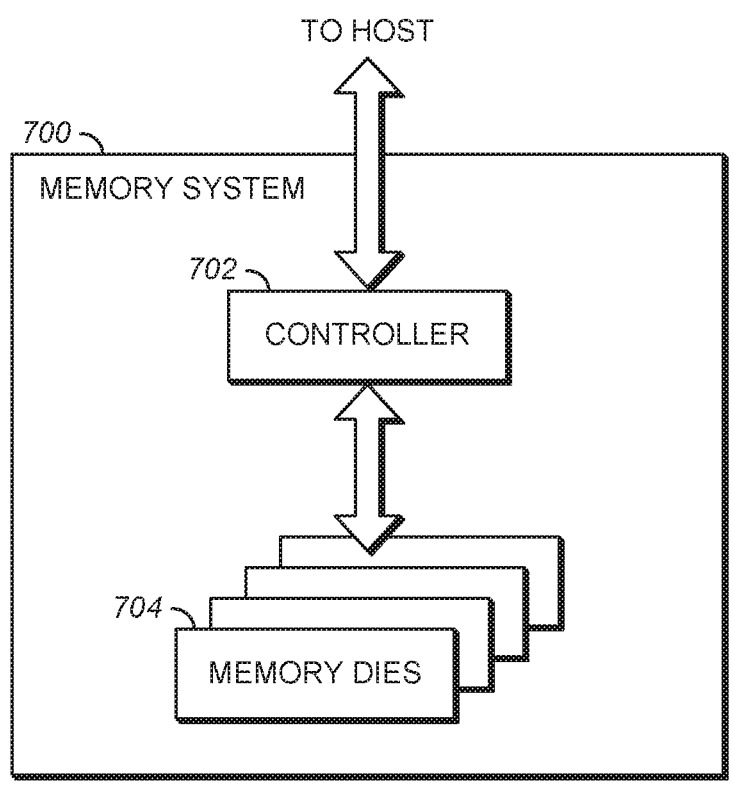
FIG. 7 generally illustrates a block diagram of an example memory system according to an aspect of the present disclosure.

FIG. 7 generally illustrates a block diagram illustrating a memory system 700. The memory system 700 may include a controller 702 and memory that may include or be made up of one or more memory dies 704. As used herein, the term die refers to the set of memory cells, and associated circuitry for managing the physical operation of those memory cells, that are formed on a single semiconductor substrate. The controller 702 may interface with a host system and transmit command sequences for read, program, and erase operations to the non-memory die(s) 704.

The controller 702 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 702 can be configured with hardware and/or firmware to perform the various functions described herein and generally illustrated in the timing diagrams. For example, the controller can control the erase verify signal levels and the soft erase signal levels on the odd and even wordlines in the non-volatile memory. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 702 is a device that manages data stored in the memory die(s) and communicates with a host, such as a computer or electronic device. The controller 702 can have various functionality in addition to the specific functionality described herein. For example, the controller 702 can format the memory dies 704 to ensure the memory dies 704 are operating properly, map out bad flash memory cells (e.g., by using the erase verify operations as described herein), and allocate spare cells to be substituted for future failed cells. Some part of the spare cells can be used to hold firmware to operate the controller 702 and implement other features. In operation, when a host needs to read data from or write data to the memory die(s) 704, the host will communicate with the controller 702. If the host provides a logical address to which data is to be read/written, the controller 702 can convert the logical address received from the host to a physical address in the memory die(s) 704. (Alternatively, the host can provide the physical address). The controller 702 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). The controller 702 can also control the erase verify operation as described herein. The memory die 704 includes the inhibit bit lines and the program bit lines as described herein.

The interface between the controller 702 and the non-volatile memory die(s) 704 may be any suitable interface, such as flash interface, including those configured for Toggle Mode 200, 400, 800, 1000 or higher. For some example embodiments, the memory system 700 may be a card-based system, such as a secure digital (SD) or a micro secure digital (micro-SD) card. In alternate example embodiments, the memory system 700 may be part of an embedded memory system.

In the example illustrated in FIG. 7, the memory system 700 is generally illustrated as including a single channel between the controller 702 and the non-volatile memory die(s) 704. However, the subject matter described herein is not limited to memory systems having a single memory channel. For example, in some memory systems, such as those embodying NAND architectures, 2, 4, 8 or more channels may exist between the controller 702 and the memory die(s) 704, depending on controller capabilities. In any of the embodiments described herein, more than a single channel may exist between the controller and the memory die(s) 704, even if a single channel is shown in the drawings.

Figure 8:
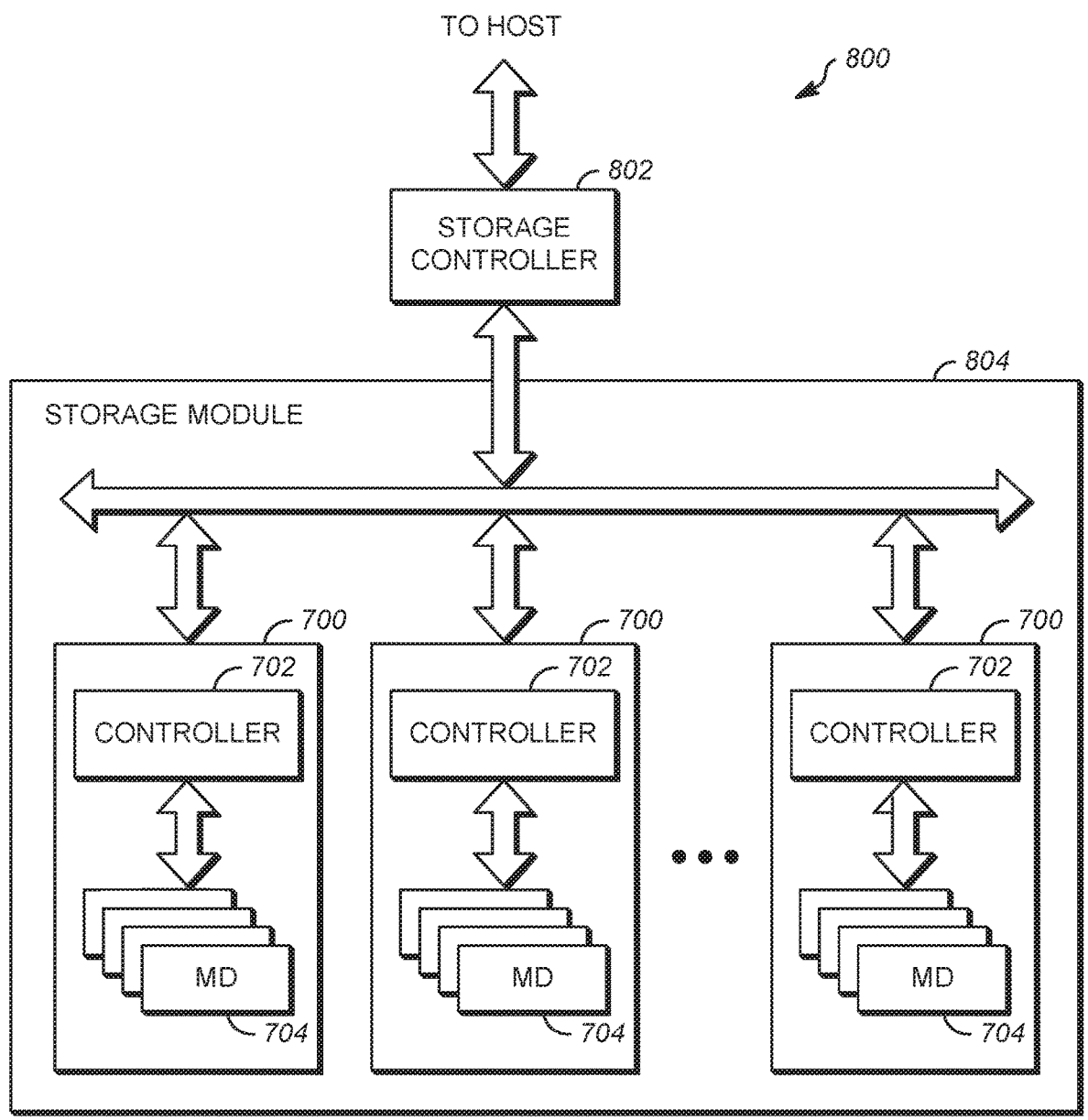
FIG. 8 generally illustrates a block diagram of an example storage module that includes a plurality of memory systems according to an aspect of the present disclosure.

FIG. 8 illustrates a storage module 800 that includes a plurality of non-volatile memory systems 700. As such, the storage module 800 may include a storage controller 802 that interfaces with a host and with a storage system 804, which includes a plurality of non-volatile memory systems 700. The interface between the storage controller 802 and non-volatile memory systems 400 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 800, in one embodiment, may be a solid-state drive (SSD), such as found in portable computing devices, such as laptop computers and tablet computers, and mobile phones.

Figure 9:
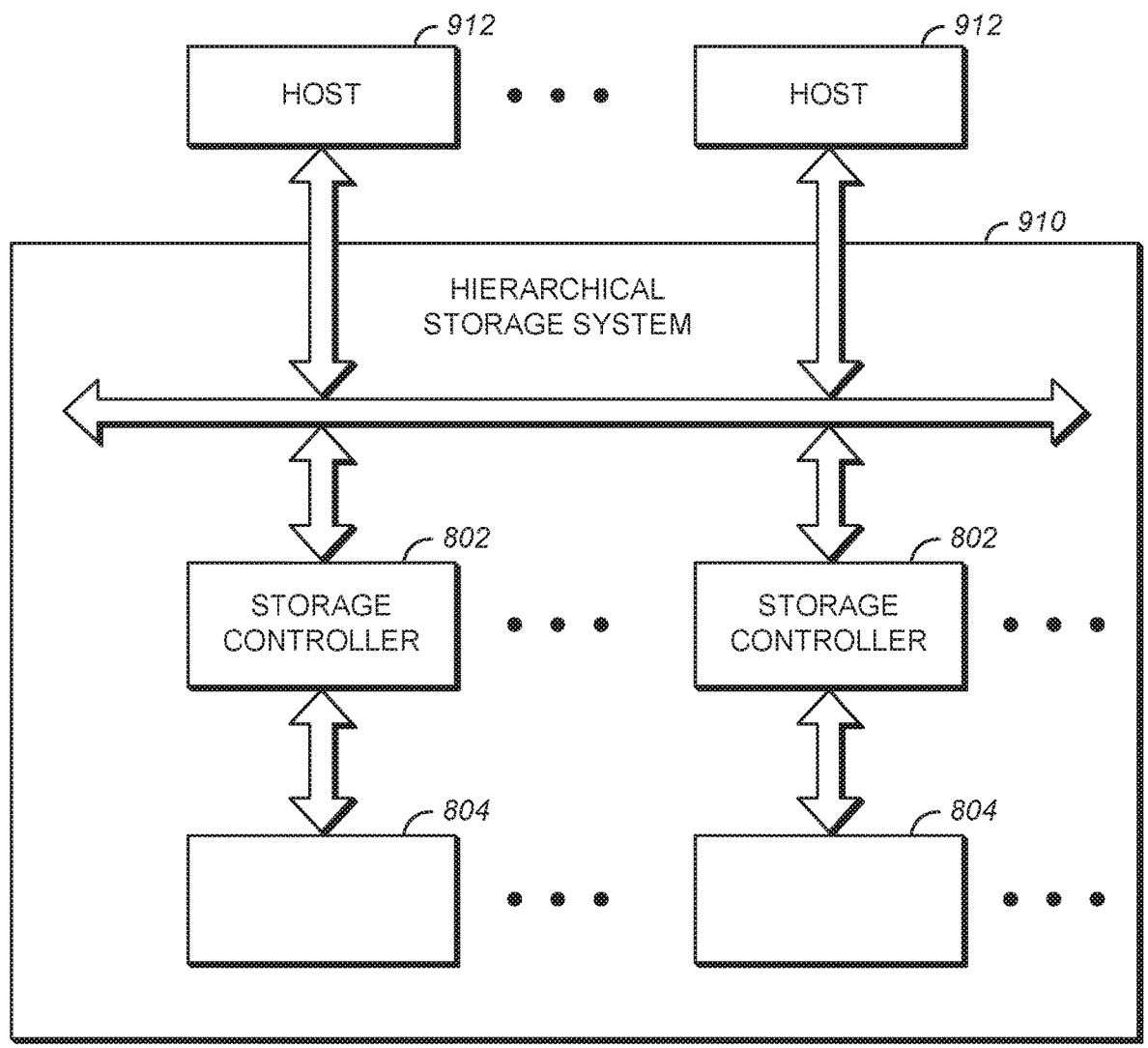
FIG. 9 generally illustrates a block diagram of an example hierarchical storage system.

FIG. 9 is a block diagram illustrating a hierarchical storage system 910. The hierarchical storage system 910 may include a plurality of storage controllers 802, each of which control a respective storage system 804. Host systems 912 may access memories within the hierarchical storage system 910 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 910 illustrated in FIG. 9 may be a rack mountable mass storage system that is accessible by multiple host computers, such as would be found in a data center or other location where mass storage is needed.

Figure 10:
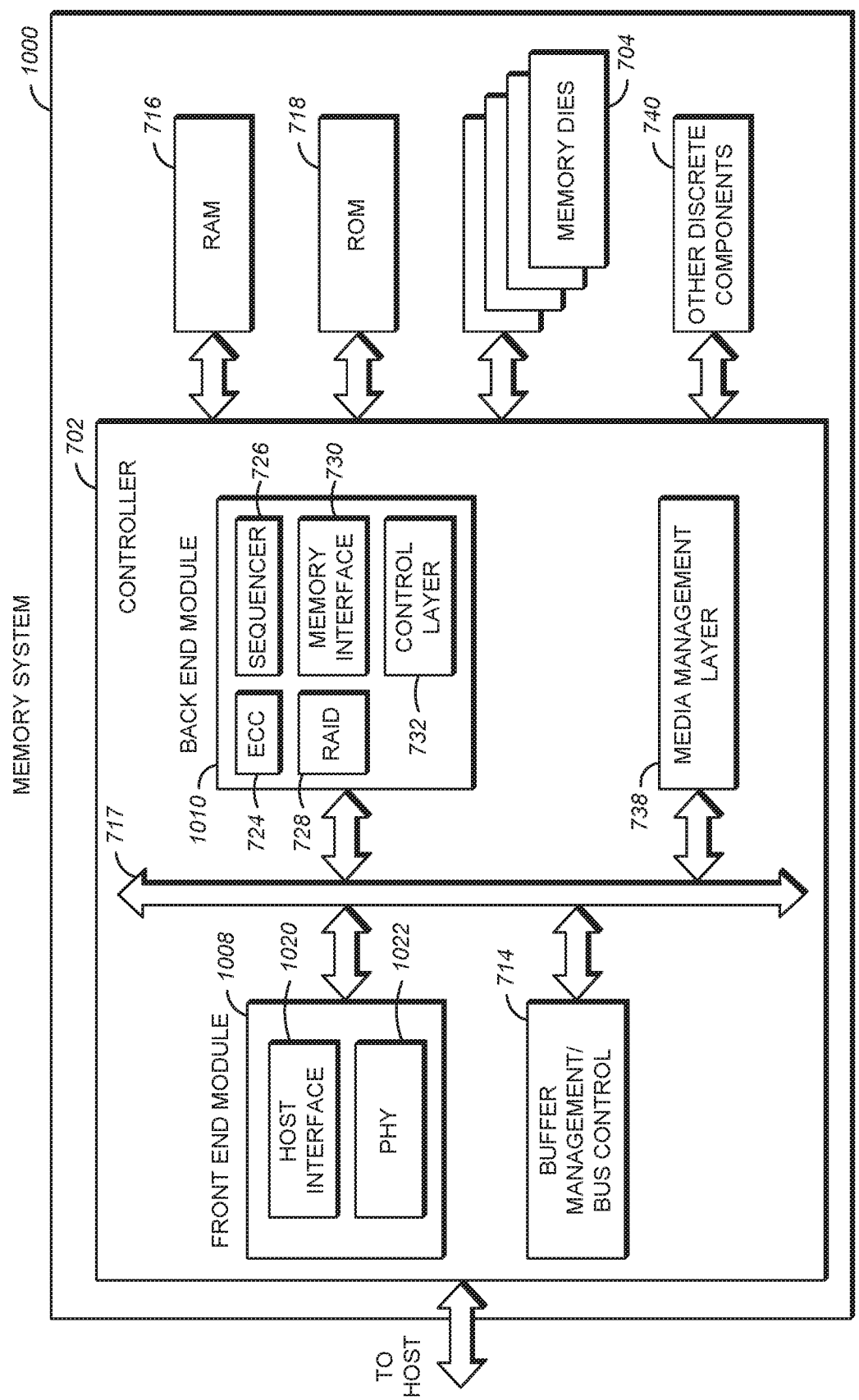
FIG. 10 generally illustrates a block diagram of an example configuration of components of a controller of the memory system of FIG. 7 according to an aspect of the present disclosure.

FIG. 10 is a block diagram illustrating exemplary components of the controller 702 in more detail. The controller 702 may include a front end module 1008 that interfaces with a host, a back end module 1010 that interfaces with the non-volatile memory die(s) 704, and various other modules that perform various functions of the non-volatile memory system 1000. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 702 may include a buffer manager/bus controller module 714 that manages buffers in random access memory (RAM) 716 and controls the internal bus arbitration for communication on an internal communications bus 717 of the controller 702. A read only memory (ROM) 718 may store and/or access system boot code. In other embodiments one or both of the RAM 716 and the ROM 718 may be located within the controller 702. In yet other embodiments, portions of RAM 716 and ROM 718 may be located both within the controller 702 and outside the controller 702. Further, in some implementations, the controller 702, the RAM 716, and the ROM 718 may be located on separate semiconductor dies.

Additionally, or alternatively, the front-end module 1008 may include a host interface 1020 and a physical layer interface (PHY) 1022 that provide the electrical interface with the host or next level storage controller. The choice of the type of the host interface 1020 can depend on the type of memory being used. Example types of the host interface 1020 may include, but are not limited to, SATA, SATA Express, SAS, Fibre Channel, USB, PCIe, and NVMe. The host interface 1020 may typically facilitate transfer for data, control signals, and timing signals.

The back-end module 1010 may include an error correction code (ECC) engine or module 724 that encodes the data bytes received from the host, and decodes and error corrects the data bytes read from the non-volatile memory die(s) 704. The back end module 1010 may also include a command sequencer 726 that generates command sequences, such as program, read, and erase command sequences, to be transmitted to the non-volatile memory die(s) 704. Additionally, or alternatively, the back end module 710 may include a RAID (Redundant Array of Independent Drives) module 728 that manages generation of RAID parity and recovery of failed data. The RAID parity may be used as an additional level of integrity protection for the data being written into the non-volatile memory system 1000. In some cases, the RAID module 728 may be a part of the ECC engine 724. A memory interface 730 provides the command sequences to the non-volatile memory die(s) 704 and receives status information from the non-volatile memory die(s) 704. Along with the command sequences and status information, data to be programmed into and read from the non-volatile memory die(s) 704 may be communicated through the memory interface 730. In one embodiment, the memory interface 730 may be a double data rate (DDR) interface and/or a Toggle Mode 200, 400, 800, or higher interface. A control layer 732 may control the overall operation of back end module 710.

Additional modules of the non-volatile memory system 1000 illustrated in FIG. 10 may include a media management layer 738 that performs certain memory management functions such as wear leveling of memory cells of the memory dies 704, address management, and facilitates folding operations. Other memory management functions may be possible. The non-volatile memory system 1000 may also include other discrete components 740, such as external electrical interfaces, external RAM, resistors, capacitors, or other components that may interface with the controller 702. In alternative embodiments, one or more of the RAID module 728, media management layer 738 and buffer management/bus controller 714 are optional components that may not be necessary in the controller 1002.

Figure 11:
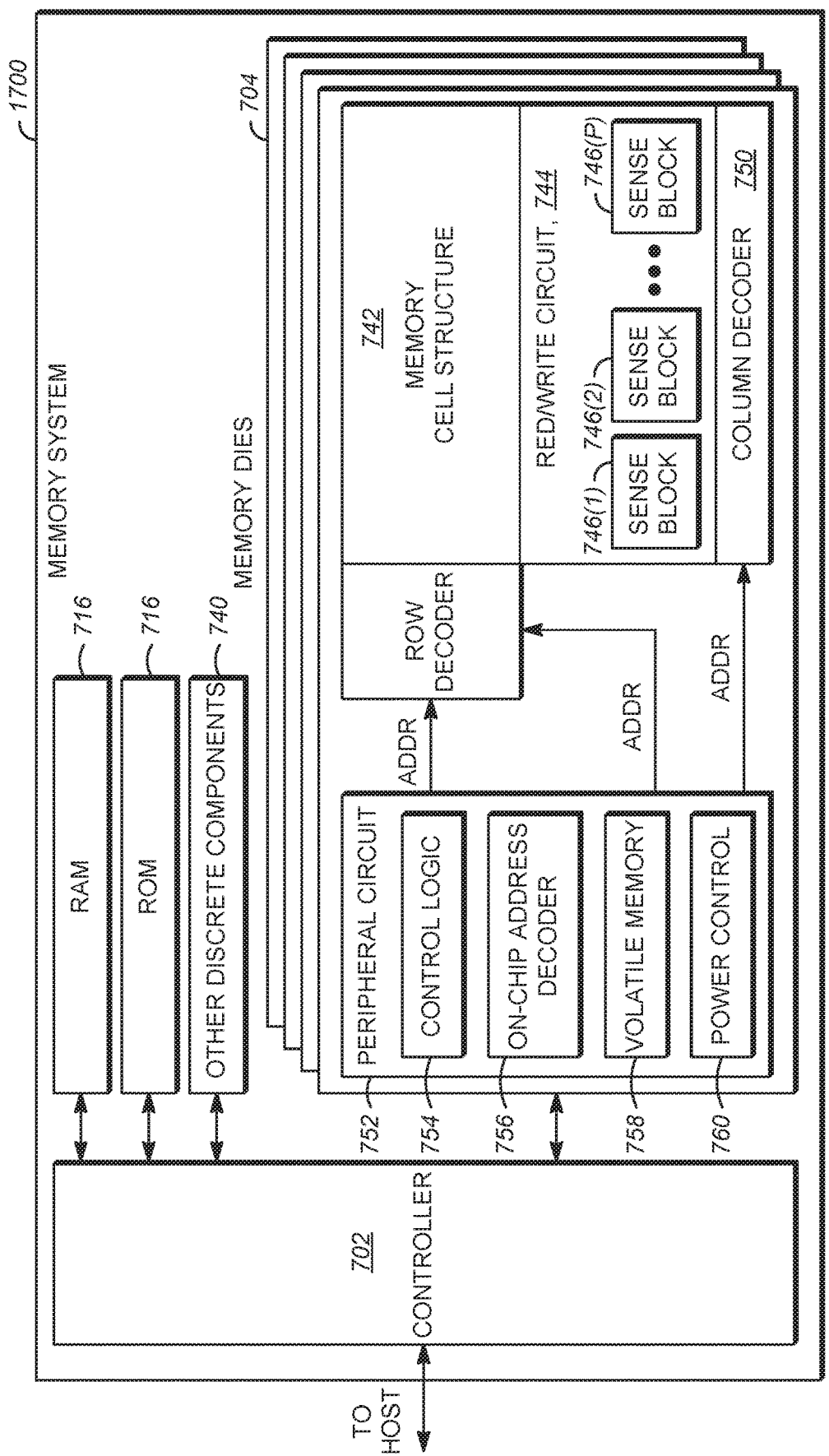
FIG. 11 generally illustrates a block diagram of an example configuration of components of a memory die of the memory system of FIG. 7 according to an aspect of the present disclosure.

FIG. 11 is a block diagram of an example configuration of components of a memory die 704 in more detail. The memory die 704 may include a memory cell structure 742 that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure 742. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 742 of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon.

In addition, a plurality of memory cells that form the entire memory cell structure 742, or at least a portion of the memory cell structure 742, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three-dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

The terms "top" and "bottom" are also used to refer to the relative positioning of components of the figures, usually in the z-direction and/or along the z-axis. In general, "bottom" components are positioned or disposed farther the z-direction from the bitlines BLm and the "top" components are positioned or disposed closer in the z-direction to the bitlines.

Although the terms "upper" and "lower," "above" and "below," and "top" and "bottom" are used to describe the relative position of components in a nonvolatile memory, they should not be construed as limiting the relative positioning of the components since a memory die, or the memory system as a whole, can be oriented in any of various positions.

With respect to the components of a memory device, it includes a plurality of bias elements and a plurality of control lines. A bias element is a component or unit of a memory that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases. The wordlines can be biased to the high level, a float level (no biasing), a zero (ground) level for an erase verify with the odd or even wordlines being used to drive the selected one of the odd or even wordlines to a negative state.

The control lines of a block in the memory device may be organized, arranged, characterized, divided, or configured into a plurality of different types of control lines. The control lines may be organized into types by the way that they bias the bias elements. For example, control lines of the same type may bias the bias elements in the same way, such as by biasing type of bias elements and/or the same types of terminals of the bias elements.

For NAND technology, the control lines of a block may be organized into three main types, including control gate lines, bit lines, and source lines. A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements. In particular example configurations, a bit line biases drain terminals by applying its bit line voltage to one or more drain ends or sides of one or more channel element groups and/or associated channels, and/or by biasing one or more drain ends or sides of one or more channel element groups and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. Channel element groups, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more channel element groups and/or associated channels, and/or by biasing one or more source ends or sides of one or more channel element groups and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Additionally, or alternatively, the source line of a block may alternatively be referred to as a cell source line CELSRC. Channel element groups, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage (e.g., the high level, the erase verify level or the low level) to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, or alternatively, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular, example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

Drain ends of channel element groups are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated channel element groups to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a channel element group to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, source ends of channel element groups are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated channel element groups to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a channel element group to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Additionally, or alternatively, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

Additionally, or alternatively, the memory cells of a block or of the memory cell structure generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 442, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 442, including blocks and word line cell groups of the memory cell structure 442, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

The memory cells store data by being configured in memory states in NAND. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, the memory as described herein may include a power control circuit that is configured to generate and supply control line voltages (including voltage pulses) to control lines of the memory cell structures. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit also be configured to generate and/or supply voltages other than the control lines voltages, including other voltages that may be supplied to the memory cell structure, the read/write circuits, the sense blocks, and/or other circuit components on the memory die 404.

The power control circuit may include any of various circuit topologies or circuit configurations to generate and/or supply the voltages at appropriate levels to perform memory operations, (including read, program/write, sense, verify and erase operations), such as driver circuits, current sources, charge pumps, reference voltage generators, regulators, and pulse generation circuits, or any of various combinations thereof. Other types of circuits to generate the voltages may be possible. In addition, the power control circuit may communicate with and/or be controlled by the control logic circuit, the read/write circuits, and/or the sense blocks in order to supply the voltages at appropriate levels and at appropriate times to carry out the memory operations.

During read operations, the power control circuit may bias word lines at read threshold voltage levels Vr in order to read the data values of the data that the memory cells are storing. A threshold voltage level Vr for a given memory state may have different optimum values for different operating conditions, including different process conditions, different program/erase cycles, different retention times, different temperatures, different disturb conditions, or combinations thereof. For a given storage scheme, the memory system, at the controller side, and/or at the memory die side, may maintain a data structure, such as a table, that identifies one or more sets of read threshold levels for the power control circuit to use to bias the word lines during read operations. The data structure may include multiple sets of read threshold levels; each corresponding to a different area of the memory dies 404.

The memory system 400 may be configured to perform a read threshold calibration process that updates or revises one or more sets of the read threshold levels maintained in the data structure to more optimal values corresponding to changes in operating conditions. In various embodiments described herein, the read threshold calibration process that the memory system 400 performs may be based on bit error rates (BERs) determined from data read from the memory dies 404. The data read from the memory dies 404 to perform the calibration may be performed in response to host read requests. In addition or alternatively, the calibration may be a continuous process, such as a process continuously performed as host read requests are received, rather than as a discrete background process triggered by a certain metric, such as program/erase cycle count, as an example. Also, the calibration process may leverage the way in which the read/write circuit reads data based on pages (e.g., lower, middle, upper) in order to determine voltage bins across a threshold voltage range over which the threshold voltage distribution curves extend, and BERs for those bins. Based on the determined BERs, the memory system 400 may determine in which direction to shift a read voltage level (increase or decrease), and by how much.

In further detail, the read/write circuit may execute a read operation to read one or more pages of data from the memory dies 404. To do so, the read/write circuit may execute the read operation in a sequence of stages dependent on the page types. For example, to read data from a page of MLC cells configured to store two bits-per-cell, the read/write circuit may read the lower page first in a first stage, and then the upper page in a second stage. As another example, to read data from a page of MLC cells configured to store three bits-per-cell, the read/write circuit may read the lower page first in a first stage, then the middle page in a second stage, and then the upper page in a third stage.

To read a given page, sense circuits of the sense blocks, coupled to the memory cells storing the page, perform a predetermined number of sense operations, each with the word lines coupled to the memory cells biased at an associated one of the read threshold voltage levels Vr. For an SLC storage scheme, the power control circuit biases the word lines with the threshold voltage VrA associated with program state A, and the sense circuits perform a single sense operation. In response to the sense operation, the sense circuits identify those SLC cells in the erase state Er as storing a logic 1 value, and identify those SLC cells in memory state A as storing a logic 0 value. The erase verify may use the wordline charging methods are described herein.

For MLC storage schemes, to read a given page, sense circuits coupled to the memory cells storing the page perform multiple sense operations, such as two, three, or four sense operations, each with the word lines biased at a different one of the read threshold voltage levels Vr. The read threshold levels Vr that are applied depend on how many bits-per-cell the MLC cells are storing, which page is being read, and which number sense operation is being performed. In one example three bits-per-cell MLC storage scheme, to read a lower page, the sense circuits perform two sense operations, including a first sense operation with the word lines biased at the read threshold level VrA associated with memory state A, and a second sense operation with the word lines biased at the read threshold level VrE associated with memory state E. Read threshold voltage levels VrA and VrE applied during first and second sense operations.

The present disclosure includes methods and systems for bit line boosting that take into account real world operation. The bit lines can be boosted to charge the inhibit channel beyond VDDS, which under conventional inhibit schemes may not reach the VDDSA level. The inhibit bit line is boosted above its inhibit value by floating the inhibit bit line and then using its capacitive link to the adjacent program bit line, which is boosted to a greater than zero voltage, e.g., VBBL (sometimes, one volt). An aspect of the present disclosure includes detection circuitry at the far end of the bit line so that the inhibit bit line reaches at least its non-current limited state before switching to floating state and boosting through capacitive coupling. Another aspect of the present disclosure is to length time period in which the inhibit bit line is boosted such that the charge time period (P6) before the boost time period (P7) is lengthened to allow the far end of the inhibit bit line to reach a high state (e.g., closer to VDDSA) before bit line boost is applied. This can assist in the far end of the bit line to reach the high state before the bit line boost is applied.

Memory devices, like most semiconductor devices, continue to shrink in size to pack more circuits per chip. In memory devices there may be many of the same size conductive paths adjacent one another, which are constantly being moved closer together. This results in a greater signal delay along one of the conductive paths (e.g., bit lines) due to capacitance between the conductive paths, i.e., $C=(\varepsilon*A)/d$, where C is capacitance is farads, $\varepsilon$ is permittivity of the dielectric, A is the area of the plate overlap, and d is the distance between the plates. As the capacitive effects increase, the RC delay may also increase. This is true for bit lines as they are typically aligned closely adjacent one another in the X direction and have the same dimensions in the X and Y directions (See FIG. 6). Moreover, bit lines in non-volatile memories separated from one another by less than 50 nm, and can be in the range of about 25-30 nm. This increases the capacitive effect between adjacent bit lines. This adds to the ability of the present methods and systems to boost a selected (inhibit) bit line to a higher voltage level using its capacitive coupling to the adjacent bit lines, after waiting for the far end of the bit line to reach the desired voltage.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A NAND memory pre-charge for programming method, comprising:
   receiving a program command;
   holding a program bit line at a low voltage level;
   turn on a select gate drain connected to a vertical string of memory cells;
   when the select gate drain is at a high level, driving an inhibit bit line for a first precharge time period with a constant current;
   delaying program bit line boost for a second precharge time period while continuing to drive the inhibit bit line to account for a resistance-capacitance (RC) delay on the inhibit bit line; and
   boosting the program bit line at the end of the second time period to a program voltage level.

2. The method of claim 1, wherein delaying program bit line boost for a second precharge time period overcomes the RC delay in the inhibit bit line based on capacitive coupling of the program bit line and the inhibit bit line, which are adjacent each other.

3. The method of claim 1, wherein the inhibit bit line and program bit line are capacitively coupled.

4. The method of claim 1, wherein driving the inhibit bit line includes applying voltage at a near end of the inhibit bit line.

5. The method of claim 4, wherein delaying program but line boost includes sensing a voltage level at a far end of the inhibit bit line.

6. The method of claim 5, wherein sensing includes reading the voltage at the far end of the inhibit bit line at a comparator positioned at the far end of the bit line to determine whether the voltage at the far end of the inhibit bit line reaches an inhibit voltage level.

7. The method of claim 5, wherein reading includes changing a state of sensing memory cell at the far end of the inhibit line, the memory cell changing state when the far end of the inhibit bit line reaches the inhibit voltage.

8. The method of claim 5, wherein reading includes changing phase in the memory cell of a phase change memory array connected to the far end of the inhibit bit line.

9. The method of claim 5, wherein reading includes changing resistance in the memory cell of a resistive memory that changes resistive state at the inhibit voltage level.

10. A NAND memory, comprising:
    a plurality of bit lines adjacent to one another on a same level, the bit lines being elongate from a first end to a second end;
    a plurality of memory strings with a plurality of memory cells and arranged in an array of rows and columns, the plurality of memory strings being connected to plurality of bit lines with one bit line of the plurality of bit lines defining a column in the array;
    a plurality of wordlines connected to rows of in the array;
    bit line drive circuitry connected to the first end of the plurality of bit lines;
    sense circuitry connected to the second end of the plurality of bitlines; and
    controller circuitry electrically connected to the bit line drive circuitry and the sense circuitry and configured to:
       hold a program bit line of the plurality of bit lines at a low voltage level;
       turn on a select gate drain connected to a string of the plurality of memory strings to a high level;
       when the select gate drain is at the high level, drive an inhibit bit line of the plurality of bit lines for a first precharge time period with a constant current;
       delay program bit line boost for a second precharge time period while continuing to drive the inhibit bit line to account for the RC delay in the inhibit bit line and the program bit line, which is adjacent the inhibit bit line; and boost the program bit line at an end of the second time period to a program voltage level.

11. The memory of claim 10, wherein the control circuitry is configured to delay program bit line boost for a second precharge time period to overcome the RC delay in the inhibit bit line based on the capacitive coupling of the program bit line and the inhibit bit line, which are adjacent to each other.

12. The memory of claim 10, wherein the inhibit bit line and the program bit line are capacitively coupled.

13. The memory of claim 10, wherein the bit line drive circuitry drives the inhibit bit line by activating the bit line drive circuitry to apply voltage at the first end of the inhibit bit line.

14. The memory of claim 13, wherein the sense circuitry senses a voltage level at the second end of the inhibit bit line and triggers the control circuitry to drive the program bit line of the plurality of bit lines.

15. The memory of claim 14, wherein the sensing circuitry includes a comparator to determine whether the voltage at the second end of the inhibit bit line reaches an inhibit voltage level to trigger the control circuitry to drive the program bit line.

16. The memory of claim 14, wherein the sensing circuitry includes a sense memory cell at the far end of the inhibit line, the sense memory cell changing state when the second end of the inhibit bit line reaches the inhibit voltage and the change of state triggering the control circuitry to drive the program bit line.

17. The memory of claim 16, wherein the sense memory cell includes a phase change memory cell that changes phase when the voltage at the second end reaches the inhibit voltage.

18. The memory of claim 14, wherein the sense memory cell includes a resistive memory that changes resistive state at the inhibit voltage level.

* * * * *